United States Patent [19]
Umaba et al.

[11] Patent Number: 5,111,743
[45] Date of Patent: May 12, 1992

[54] SCREEN PROCESS PRINTING PLATE FOR PRINTING WITH HIGH PRECISION

[75] Inventors: Takayuki Umaba; Jiro Ono; Syunsuke Takagi; Makoto Sawada; Hideki Adachi; Hirofumi Shimizu; Mokuhei Hashimoto; Tetsu Takahashi, all of Kyoto, Japan

[73] Assignee: Dainippon Screen Mfg. Co., Ltd., Japan

[21] Appl. No.: 749,469

[22] Filed: Aug. 15, 1991

Related U.S. Application Data

[63] Continuation of Ser. No. 529,064, May 29, 1990, abandoned.

[30] Foreign Application Priority Data

May 29, 1989 [JP] Japan .................................. 1-62165

[51] Int. Cl.$^5$ ............................................. B05C 17/08
[52] U.S. Cl. .................................. 101/127; 101/127.1; 101/128.1; 101/128
[58] Field of Search .................. 101/114–118, 101/121, 123–127, 127.1, 128, 128.1, 128.21, 128.4, 129

[56] References Cited

U.S. PATENT DOCUMENTS

| | | | |
|---|---|---|---|
| 3,865,154 | 2/1975 | Cox et al. | 101/128.4 |
| 3,889,629 | 6/1975 | Black | 101/128.4 |
| 4,060,030 | 11/1977 | Noscheese | 101/127.1 |
| 4,876,957 | 10/1989 | Sakai | 101/128.4 |

FOREIGN PATENT DOCUMENTS

| | | | |
|---|---|---|---|
| 1193150 | 9/1985 | Canada | 101/114 |
| 1306729 | 3/1987 | U.S.S.R. | 101/114 |

Primary Examiner—Edgar S. Burr
Assistant Examiner—Joseph R. Keating
Attorney, Agent, or Firm—Ostrolenk, Faber, Gerb & Soffen

[57] ABSTRACT

A screen process printing plate includes a screen holding plate provided with an opening and having flexibility and restoring capability. A screen is fixed to the screen holding plate and covers at least a part of the opening. A fixed member is provided for fixedly holding one end of the screen holding plate and a movable member is provided for holding an opposite end of the screen holding plate. The movable member is movable in a direction parallel to a plane defined by the screen. A biasing device is provided for biasing the movable member in a predetermined first direction away from the fixed member and in the direction of movement of the movable member. When a squeegee presses the screen holding plate and the screen, the screen holding plate and the screen are flexibly curved easily into contact with an object to be printed. Since the tension is supported by the screen holding plate, excessive tension does not occur in the screen. The screen is snapped-off by the restoring force of the screen holding plate.

11 Claims, 5 Drawing Sheets

SCREEN PROCESS PRINTING PLATE FOR PRINTING WITH HIGH PRECISION

This is a continuation of application Ser. No. 07/529,864 filed May 29, 1990, now abandoned.

BACKGROUND OF THE INVENTION

1. Field of the Invention

The present invention relates to screen process printing plates for use in fabrication of thick film integrated circuits, printed circuit boards, hybrid circuits, etc. and particularly it relates to a screen process printing plate which enables printing with high accuracy and durability.

2. Description of the Related Art

Screen process printing is carried out according to the following procedures. A screen process printing plate is prepared in a manner in which figures or patterns consisting of openings and non-open portions are formed mainly by a photomechanical process on a screen stretched on a screen frame. Printing liquid such as printing paste or printing ink is put on the screen process printing plate. An instrument called a squeegee is used to slide over the surface of the screen while being pressed against the surface. The ink is squeezed out from the openings and the figures or patterns are transferred onto a surface of an object subjected to printing placed under the screen.

Figure 1:
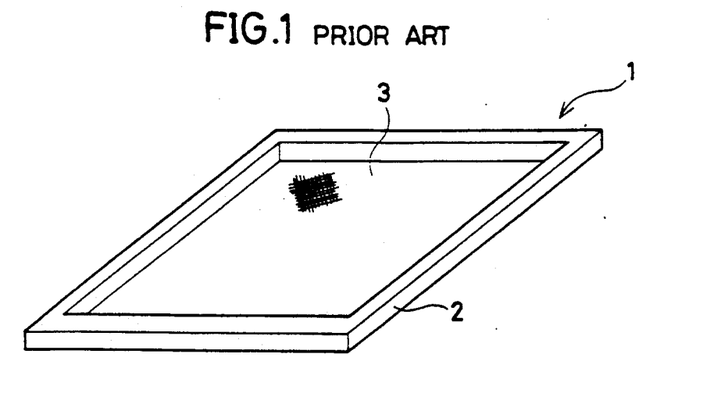
FIG. 1 is a perspective view of a conventional screen process printing plate.
Figure 2:
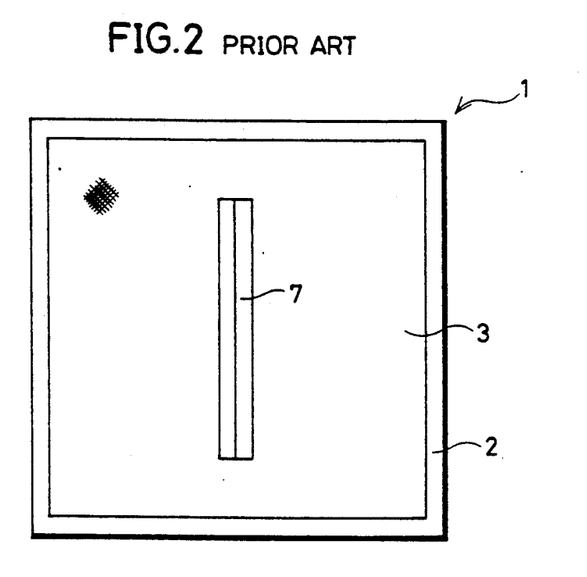
FIG. 2 is a plan view of the conventional screen process printing plate of FIG. 1.

Referring to FIGS. 1 and 2, the screen frame 1 includes a rectangular frame body 2 of wood or metal, and a screen 3 attached to the frame body 2. The four sides of the screen 3 are fixed to the frame body 2 with a prescribed tension by using adhesives or other suitable methods.

Figure 3:
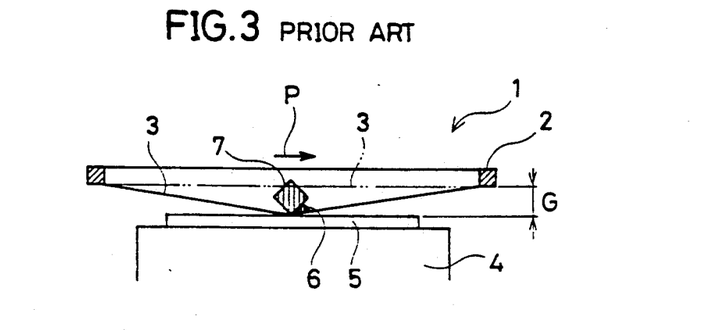
FIG. 3 is a side sectional view showing printing with the conventional screen process printing plate of FIGS. 1 and 2.

Referring to FIG. 3, when printing is to be carried out, an object 5 subjected to printing is placed on a printing table 4 by vacuum contact or other method. The frame body 2 is fixed to allow a gap G between the material 5 and the screen 3 and the screen frame 1 is set in the main body of a printing apparatus. The screen 3 is stretched horizontally as shown by the broken line. Ink 6 is applied to the screen 3. The screen 3 is pressed by the squeegee 7 and bent, so that the screen 3 contacts the surface of the material 5. The screen 3 is stretched to the position shown by the solid lines. While the squeegee 7 moves in the direction shown by the arrow P, the ink 6 is squeezed out and transferred onto the material 5 through the openings of the screen 3.

As the squeegee 7 advances, the position of contact between the screen 3 and the material 5 moves. The screen 3 adheres to the material 5 at the contact position due to viscosity of the ink. However, when the squeegee 7 further moves, the screen 3 at the previous contact position gets away from the material 5 due to its own tension. This phenomenon is called "snapping-off".

The above-mentioned screen generally includes woven meshes of textile structure consisting of fibers of silk, nylon, polyester, or the like. In some cases, a woven, metallic mesh of stainless steel may be used. In other cases, the screen includes a metallic mesh formed by an etching method applied to metal such as stainless steel.

Figure 4:
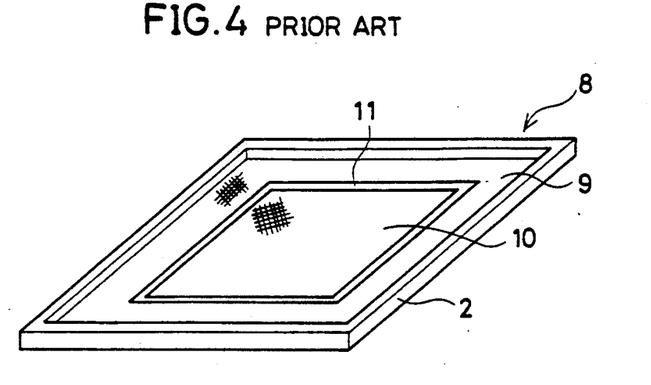
FIG. 4 is a perspective view of a conventional screen process printing plate of a combination system.
Figure 5:
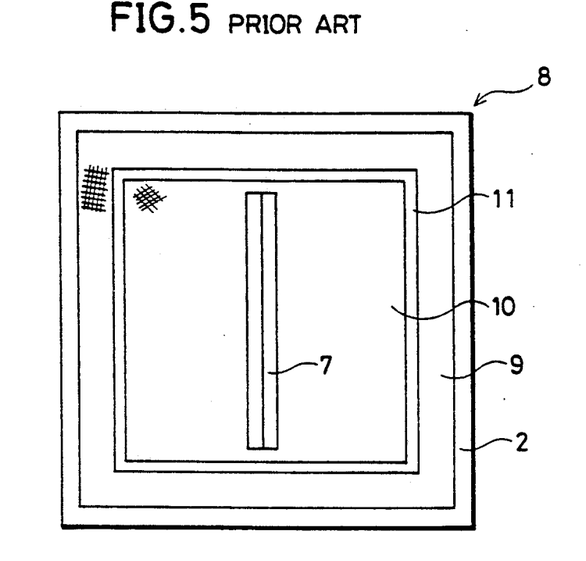
FIG. 5 is a plan view of the conventional screen process printing plate of the combination system of FIG. 4.
Figure 6:
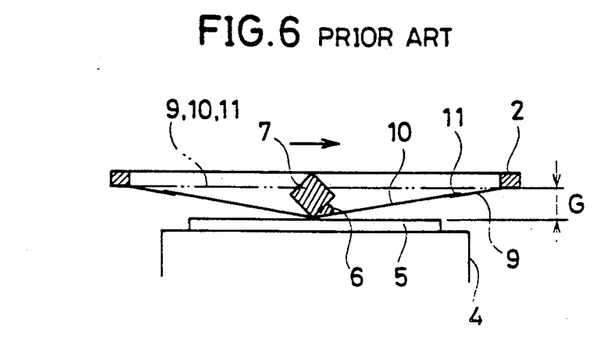
FIG. 6 is a schematic sectional view showing printing with the conventional screen process printing plate of the combination system of FIGS. 4 and 5.

Another example of a construction of a conventional screen process printing plate is disclosed, for example, in Japanese Utility Model Publication No. 55-1894. This screen process printing plate is of a so-called "combination system". Referring to FIGS. 4 to 6, the screen process printing plate 8 of the combination system includes a frame 2, an elastic film 9 attached at four sides thereof to the frame 2 with a prescribed tension, having a rectangular opening at its center, and a mesh type screen 10 of metal or the like connected to the elastic film 9 in overlap portions 11. The above-mentioned printing pattern is formed on the screen 10.

Referring to FIGS. 5 and 6, ink 6 is put on the screen 10. The squeegee 7 is operated to slide over the screen 10 while being pressed against it. Thus, the ink 7 is squeezed out through the printing pattern to the lower surface of the screen 10, whereby the prescribed pattern is transferred onto the object 5 subjected to printing.

Referring again to FIG. 3, the screen 3 stretches elastically in the printing process. As a result, the printing pattern formed on the screen 3 is deformed.

Similarly, the screen 10 of the combination system as shown in FIG. 6 also stretches elastically in the printing process. However, in the screen process printing plate 8 of the combination system, the elastic stretching of the screen 10 in the printing process is mainly borne by the elastic film 9. Stretching of the portion of the screen 10 where the printing pattern is formed is suppressed. Accordingly, there is little deformation of the printing pattern. In this regard, the screen process printing plate 8 of the combination system is excellent compared with the screen process printing plate 1 shown in FIGS. 1 to 3.

However, in either case, the screen process printing plate 1 as shown in FIGS. 1 to 3 or the screen process printing plate 8 of the combination system as shown in FIGS. 4 to 6 includes the rectangular frame body having its four sides fixed, and the screen stretched on the frame body 2. At the time of screen process printing, the squeegee slides over the upper surface of the printing plate while pressing against it. The screen is elastically stretched and deformed. Depending on the rigidity of the frame body 2, deformation in the frame body would occur in an extreme case.

In addition, the influence exerted by the frame body 2 on the deformation of the screen differs depending on the position of the squeegee. More specifically, distribution of force applied to the respective sides of the frame body 2 and to the screen differs depending on whether the squeegee 7 is located at the center of the screen process printing plate or near an end of the printing pattern. Consequently, when the squeegee 7 moves near an end of the printing pattern, abnormal deformation of the printing pattern might occur.

The recent trend in screen process printing technology is toward higher precision and higher resolution. Generally, the number of meshes per unit length of the screen is increased, in order to meet the above-mentioned demand. Thus, it is necessary for the screen to have fine meshes.

In consequence, problems as described below occur. Consider, for example, a screen of a metallic mesh formed by a plating method. It is believed that the metallic screen is not elongated very much by the pressing of the squeegee. However, distortion per unit load increases with increasing fineness of the mesh. As a result, the mesh is liable to be elastically deformed. If a relatively large tension is continuously applied to the screen, permanent deformation of the screen by a creep phenomenon is also liable to occur due to the fineness of the mesh. As a result, stretch deformation or distortion of the printing pattern occurs.

One method for solving the above-described problems, involves fixing only the opposite two sides of the screen. One side is fixed to a fixed frame body and the opposite side is fixed to a movable frame body provided in parallel with the fixed frame body. Further details of the method are below.

Figure 7:
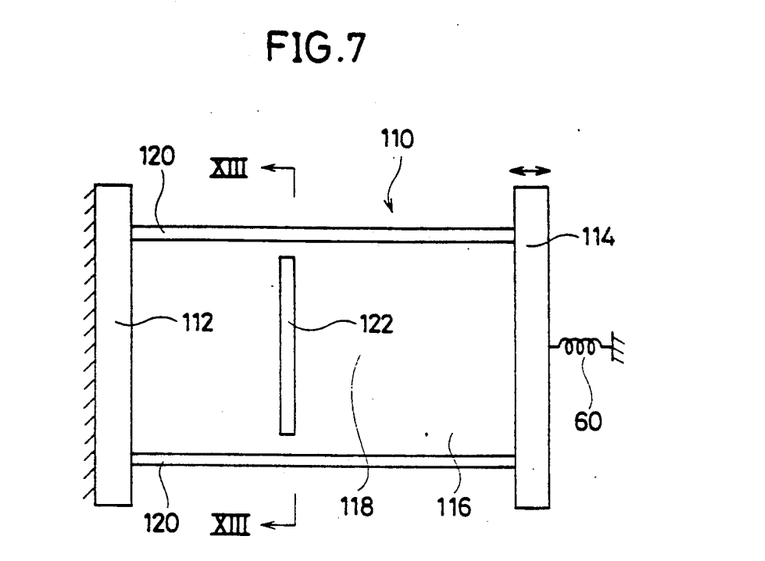
FIG. 7 is a plan view of a screen process printing plate having opposite two edges reinforced by strip portions.

Referring to FIG. 7, a screen frame 110 includes a fixed frame body 112 fixed to the main body of a printing apparatus (not shown), a screen 116 having one end fixed to the fixed frame body 112, a movable frame body 114 attached to the other end of the screen 116, and a tension spring 60 biasing the movable frame body 114 toward the side opposite to the fixed frame body 112 to stretch the screen 116. A printing plate portion 118 is formed in the central portion of the screen 116.

In order to avoid unevenness of distribution of tension, it is necessary for the screen 116 to be reinforced. The screen 116 is reinforced for example by strip portions 120 formed on opposite two sides of the screen 116 along the printing direction of the squeegee 122 with the printing plate portion 118 being provided therebetween.

The existence of the strip portions 120 for the reinforcement brings about the below-described effect. When the screen 116 is pulled by the movable frame body 114, most of the tension is applied to the strip portions 120. There is little tension applied to the screen 116. Thus, the screen 116 is unlikely to be deformed by tension. Accordingly, creep distortion hardly occurs in the screen 116.

Various reinforcing methods may be considered. The first method is as follows. In a manufacturing process of a screen process printing plate, a photosensitive material is applied to the whole surface of a screen and a figure or a pattern is formed in a central portion of the screen by a photomechanical process. During the process, two side edges of the screen are reinforced by the photosensitive material remaining on the surface of the screen. The second method is to attach metallic belts to a screen. The third method is to form metallic strips on the surface of a screen by plating.

Figure 8:
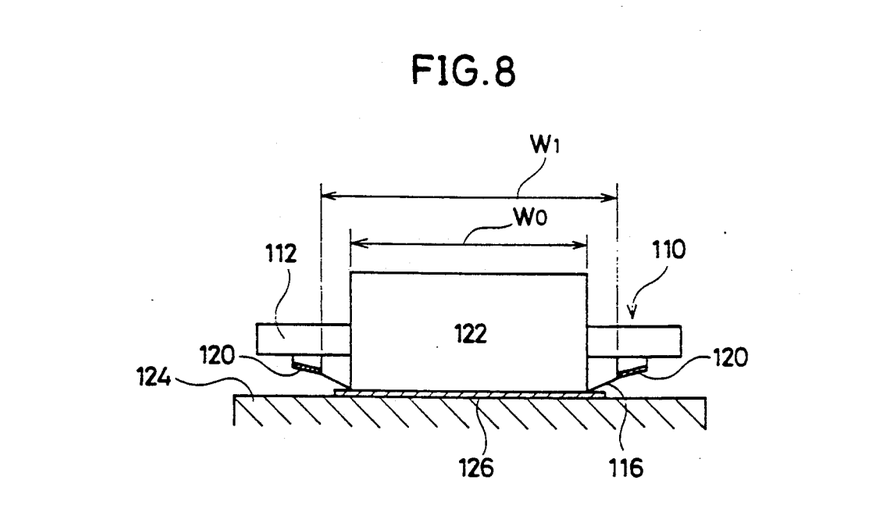
FIG. 8 is a sectional view taken along the direction VIII—VIII in FIG. 7.

However, in the screen process printing by using the above-described screen frame 110, the following disadvantages may occur. Referring to FIG. 8, the width W0 of the squeegee 122 is smaller than the width W1 of the screen 116 (corresponding to a dimension between the strips 120 for reinforcing in the screen frame 110 shown in FIGS. 7 and 8) (W0<W1). The center of the squeegee 122 in the widthwise direction substantially coincides with the center of the screen 116 in the widthwise direction at the time of printing. The central portion of the screen 116 is pulled down by the squeegee 122 and is stretched downward.

The reinforcing strips 120 and the other portions including the printing plate portion 118 have different stretching amounts in the squeegee running direction when the same tension is applied thereto. Excess force is applied to the screen 116 at the junction between the reinforcing strips 120 and the other portions including the printing plate portion 118. The screen 116 is bent in those portions, causing disadvantages such as breakage of the screen 116. Particularly, if the strips 120 are formed by plating metallic strips on the screen 116, or if the strips 120 are formed simultaneously with preparing the screen by plating, such disadvantages would be liable to occur.

SUMMARY OF THE INVENTION

Therefore, an object of the present invention is to provide a screen process printing plate which enables printing with high resolution and high precision and which has an improved durability.

Another object of the present invention is to provide a screen process printing plate which makes it possible to control deformation due to pressing of a squeegee and to carry out printing with high resolution and high precision, and which has an improved durability.

Still another object of the present invention is to provide a screen process printing plate which makes it possible to carry out printing with high resolution and high precision with little tensile deformation of a screen, and which has an improved durability.

The above-described objects can be accomplished by a screen process printing plate including a screen holding plate having flexibility and restoring force and provided with an opening. A printing screen covers at least a part of the opening of the screen holding plate and is fixed thereto and defines a plane coincident with a surface of the screen holding plate. Elasticity of the screen holding plate in the plane defined by the screen is smaller than that of the printing screen. The screen process printing plate according to the present invention further includes a fixed member for fixedly holding an end of the screen holding plate and movable member for holding another end of the screen holding plate on the side opposite to the end fixed by the fixed member The movable member is movable along a predetermined straight line parallel to the plane defined by the screen. A biasing device is provided for biasing the movable member in a predetermined first direction away from the fixing member.

The squeegee moves in a first direction parallel to the predetermined straight line while pressing the screen holding plate simultaneously on both edges of the opening. The pressed screen holding plate and the printing screen are elastically curved toward the surface of an object subjected to printing. At this time, the movable member surmounts the biasing force of the biasing device and moves toward the fixed member. Consequently, the screen holding plate and the screen are bent very easily. Since the screen holding plate is less liable to stretch compared with the screen, tension due to the above-mentioned deformation is mostly supported by the screen holding plate. Large tension does not occur in the printing screen and abnormal deformation in the center of the screen does not occur. Consequently, it is possible to carry out printing with precision by using a printing plate formed in the center of the screen.

Snapping-off is caused by the restoring force of the screen holding plate and the biasing force of the biasing device. In order to effect snapping-off in good condition, it is not necessary to apply a large tension to the screen. A large tension is not generated in the screen constantly. Consequently, even if meshes of the screen are very small, elastic deformation of the screen or deformation due to creep hardly occurs.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to FIGS. 9 to 12, a screen process printing plate 130 according to a preferred embodiment of the present invention will be described.

The screen process printing plate 130 includes: a rectangular holding frame body 132 having a step portion 134 formed on an outer side of one end of the frame body 132 and a guide plate portion 140 formed, inside of the other end thereof. A fixed frame member or body 138 is fixed to the step portion 134 by means of screws 136. A movable frame member or body 146, engaged with the guide plate portion 140 through a sliding bearing 142, is supported by the guide plate portion 140 for movement forward and backward in a running direction a of the squeegee 144 and is maintained always parallel with the fixed frame body 138. A mounting portion 150 is fixed to the movable frame body 146 by means of screws 148. A biasing device 152 is provided for biasing the movable frame body 146 in a direction opposite to the fixed frame body 138.

The biasing device 152 according to this preferred embodiment includes: a stud 154 slidably inserted in a through-hole 160 formed in the mounting portion 150 and in a through-hole 162 provided in the holding frame body 132 and having one end fixed to the movable frame body 146 so that it follows the moveable frame body 146 and the other end projecting from an outer side surface of the holding frame body 132. A tension regulating screw 156 is engaged with a screw portion formed around the other end portion of the stud 154, and a compression coil spring 158 is provided between the outer side surface of the holding frame body 132 and the regulating screw 156 around the other end portion of the stud 154.

Between the fixed frame body 138 and the mounting portion 150, there is provided a holding member 170 in the form of a thin plate having a central opening defined by a pair of holding thin plate portions 164 parallel to the running direction a of the squeegee 144 and a fixed member mounting portion 166 and a moveable member mounting portion 168 provided on both ends thereof. The mounting portions 166, 168 are fixed on the respective lower surfaces of the fixed frame body 138 and the mounting portion 150 by adhesives or the like.

Figure 9:
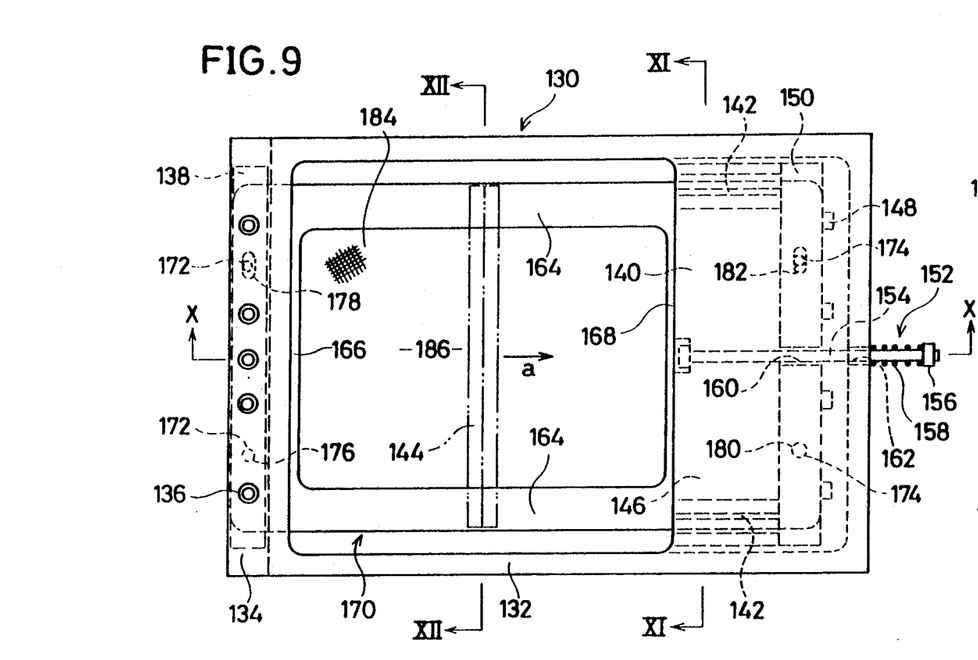
FIG. 9 is a top view of a screen process printing plate of a preferred embodiment of the present invention.
Figure 10:
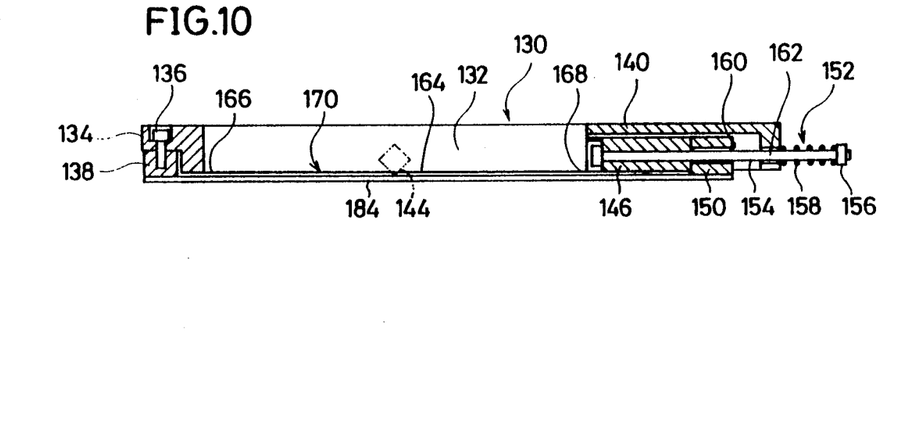
FIG. 10 is a schematic sectional view taken along the direction X—X in FIG. 9.
Figure 11:
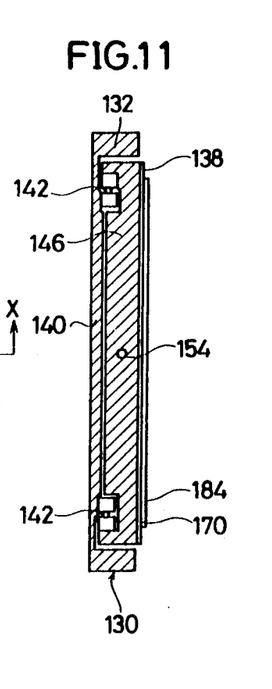
FIG. 11 is a schematic sectional view taken along the direction XI—XI in FIG. 9.
Figure 12:
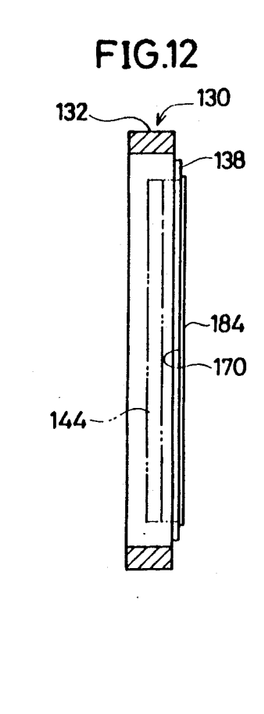
FIG. 12 is a schematic sectional view taken along the direction XII—XII in FIG. 9.

The holding member 170 is formed from a thin plate material which is neither expansible nor contractible but which is flexible. For example, the holding member may be formed of a stainless steel or plastic plate of about 0.1 to 0.2 mm in thickness. When a pressing force is applied to the holding thin plate portions 164 by the squeegee 144 in a direction perpendicular to the surface, the movable frame body 146 moves in the direction opposite to the direction a. As a result, the holding thin plate portions 164 are easily curved toward the surface subjected to printing.

The spacing between the holding thin plate portions 164 is such as to enable both ends of the squeegee 144 to be in contact therewith simultaneously. Pin holes 172 and 174 for registration are provided, respectively, in the fixing frame body 138 and the mounting portion 150. A round hole 176 and an elongate hole 178 for registration are provided in the mounting portion 166 of the holing member 170. A round hole 180 and an elongate hole 182 for registration are provided in the mounting portion 168 of the holding member 170. The holding member 170 is positioned with respect to the fixing frame body 138 and the movable frame body 146 by using those registration holes. The positioned holding member 170 is fixed to the fixing frame body 138 and the mounting portion 150.

A rectangular screen 184 is attached to the fixing frame body 138 and the mounting portion 150 through the pair of holding thin plate portions 164 of the holding member 170 and the mounting portions 166 and 168 of the holding member 170, with the four sides of the screen 184 being fixed. A printing pattern is formed in a central portion 186 which does not overlap with the holding member 170. The screen 184 is attached fixedly to the holding member 170 by using adhesives or other means. The portions of the screen 184 fixed to the holding thin plate portions 164 of the holding member 170 serve as strips for reinforcing the screen 184. The central portion 186 of the screen 184 not overlapping with the holding member 170 is a printing plate portion.

The method of mounting the holding member 170 to the fixing frame body 138 and the mounting portion 150 of the movable frame body 146 will be described below.

The movable frame body 146 is engaged with the holding frame body 132 by means of the sliding bearing 142. The mounting portion 150 is fixed to the movable frame body 146 by tightening the screws 148.

The stud 154 is put in the movable frame body 146. One end of the stud 154 is inserted in the through-hole 160 of the mounting portion 150 and in the through-hole 162 of the holding frame body 132 and projects from an outer side surface of the holding frame body 132.

The compression coil spring 158 is movably attached to the projecting stud 154. The tension regulating screw 156 is fitted on the threaded portion formed on the outer circumference of the projecting portion of the stud 154. The fixed frame body 138 is temporarily held in the step portion 134 of the holding frame body 132 by means of the fixed screws 136.

Registration pins, not shown, are inserted in those pin holes for registration. The inserted registration pins are fitted in the round hole 176, the elongate hole 178, the round hole 180 and the elongate hole 182 The holding member 170 is positioned with respect to both frame bodies 138 and 146 such that the holding thin plate portions 164 of the holding member 170 are parallel with respect to the running direction a of the squeegee 144.

After the positioning of the holding member 170, the mounting portions 166, 168 of the holding member 170 are fixed by adhesives on the respective upper surfaces of the fixing frame body 138 and the mounting portion 150 of the movable frame body 146. The registration pins are removed after the holding member 170 is mounted on the frame bodies.

After the mounting of the holding member 170 on the fixing frame body 138 and the mounting portion 150 of the movable frame body 146, the screws 136 are loosened so that the fixed frame body 138 can move slightly. By regulation of the tension regulating screw 156, prescribed tension is applied to the holding thin plate portions 164 of the holding member 170. By this regulating operation, the respective tensions applied to the holding thin plate portions 164 can be set substantially equal to each other. The screws 136 are again tightened, whereby the fixing frame body 138 can be reliably fixed to the holding frame body 132. The tension regulating screw 156 is operated again, whereby the holding thin plate portions 164 of the holding member 170 finally have a prescribed tension.

The final prescribed tension is determined by properties of the material of the holding member 170 and other related factors. For instance, the tension per unit length, $T_0$, in kg/cm, of each holding thin plate portion 164 is about 10 kg/cm.

The screen 184 is mounted in the screen process printing plate 130 in the below-described manner. In a conventional screen process printing plate, tension applied to the screen is normally about 8 kg/cm (per unit length of the screen). On the other hand, in the screen process printing plate 130 of this preferred embodiment, the tension applied to the screen is set smaller so as to prevent stretch deformation due to a creep phenomenon of the material caused by the small size of the meshes. Thus, the tension applied to the screen is determined by taking into account a minimum tension value to suppress partial distortion of the screen and taking into account various restrictions on the principles of screen process printing, and other conditions.

The tension per unit length $T_1$, in kg/cm, of the screen is smaller than the prescribed tension per unit length $T_0$, in kg/cm, applied to the holding thin plate portions 164 of the holding member 170 ($T_1 < T_0$) An example of the tension $T_1$ applied to the screen is about 0.5 to 1 kg/cm. The four sides of the screen 184 having the above mentioned tension are stretched and fixed on the surfaces of the pair of holding thin plate portions 164 of the holding member 170 and the mounting portions 166, 168 by using adhesives or other means.

Even if the tension of the screen is set small as described above, the screen can be snapped off smoothly at the time of printing. This is because the restoring force of the screen enabling the snapping-off is given not by the tension of the screen but by the restoring force of the holding thin plate portions 164.

Even if the tension $T_1$, kg/cm, of the screen 184 is set smaller (for example $T_1 = 0.7$ kg/cm) than the prescribed tension $T_0$, in kg/cm, of the holding thin plate portions 164 of the holding member 170, the holding thin plate portions 164 are curved a little toward the center of the holding member 170 in the direction perpendicular to the running direction of the squeegee due to the tension of the screen 184. In consequence, in the case of a screen having a small value of distortion per unit load, wrinkles might occur in the screen. Such phenomenon is particularly apparent in the case of screens including stainless steel meshes, metallic meshes formed by using a plating method or an etching method, etc.

In the case of screens having a large value of distortion per unit load, namely, screens made of cloth, such as, polyester or nylon, wrinkles do not appear due to the above-mentioned deformation of the holding thin plate portions but the distribution of tension in the surface of the screen becomes uneven. Therefore, if a screen of a material having a small value of distortion per unit load is to be used or, if the distribution of the tension in the surface of the screen is to be made even, it is necessary to stretch the screen by a method as described below.

First, a screen having a large value of distortion per unit load (e.g., a polyester cloth screen or a nylon cloth screen) is set on the holding thin plate portions 164 of the holding member 170 and the two mounting portions 166, 168 under a predetermined tension $T_2$ by using adhesives or the like. As a result, the holding thin plate portions 164 are deformed toward the inside of the screen due to the tension of the screen. After the deformation is generated in advance, a screen having a small value of distortion per unit load (e.g., a screen formed by a stainless steel mesh or a metallic mesh formed by a plating method) is set on the holding member 170 under the tension $T_1$ by using adhesives or the like.

The screen set previously on the holding member 170 is cut along the respective inner sides of the holding thin plate portions 164 and the mounting portions 166, 168, whereby the central portion of the screen is removed.

The screen thus set on the holding member 170 by the above-described method makes it possible to prevent occurrence of wrinkles in the screen. In addition, the tension distribution in the surface of the screen can be made even. In this case, the tension $T_2$ is determined taking into account the tension $T_1$.

After the screen is set on the holding member 170, a printing pattern is formed in the screen by a process printing method similar to the method in a conventional screen process printing plate.

Figure 13:
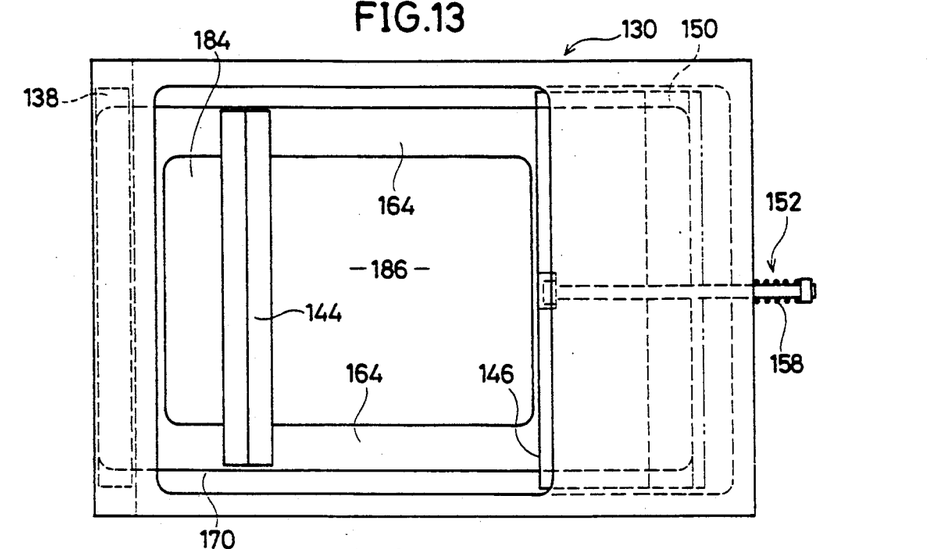
FIG. 13 is a plan view of a screen process printing plate of the embodiment of the present invention in a printing process.
Figure 14:
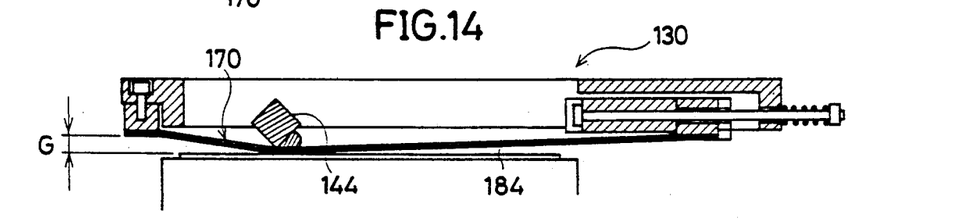
FIG. 14 is a schematic sectional view taken along the direction XIV—XIV in FIG. 13.

Operation of the screen process printing apparatus using the above-described screen process printing plate 130 is as follows. Referring to FIGS. 13 and 14, the squeegee 144 is positioned so that the two ends thereof are placed on the two thin plate portions 164 of the holding member 170. In the same manner as that in the prior art, the lower end of the squeegee 144 is pressed against the screen 184 and slides thereon. The screen 184 is attached to the holding member 170 that is not expansible and it is held integrally by the holding member 170. The stretching of the screen 184 along the running direction a of the squeegee 144 is regulated by the holding thin plate portions 164 of the holding member 170.

The pressing force of the squeegee 144 enables the movable frame body 146 and the mounting portion 150 to be pulled and moved toward the fixed frame body 138 against the force of the compression coil spring 158 of the biasing device 152. The holding thin plate portions 164 of the holding member 170 are flexibly curved toward the surface subjected to printing. The screen 184 is curved toward the surface subjected to printing together with the holding thin plate portions 164 and contacts the surface. The screen 184 is not stretched nor deformed in the printing direction in spite of the pressing force of the squeegee 144. A tension for snapping-off is applied to the screen 184 after the passage of the squeegee 144, by those holding thin plate portions 164 and biasing device 152.

In the above-described printing operation, an excess tension does not occur in the screen 184. The process printing plate portion 186 at the center of the screen 184 is not deformed. Consequently, printing can be carried out with precision. Since a large tension is not applied to the screen 184 continuously, distortion of the screen due to creep does not occur. Thus, the durability of the screen 184 is improved.

The squeegee 144 presses the two holding thin plate portions 164 and the screen 184 simultaneously. Along the edge of the squeegee 144, the screen 184 and the two holding thin plate portions 164 form a straight line. An excessive force is not applied to the screen 184 at the end portions of the squeegee 144. Accordingly, the screen 184 is unlikely to be broken. In screen process printing using the conventional process printing plate (as shown in FIGS. 1 to 6), the value of the gap G shown in FIGS. 3 and 6 can not be increased because it is necessary to avoid permanent deformation of the screen or an increase of stretching thereof due to the printing. The gap G is generally about 0.5% of the dimension between the frames in the running direction of the squeegee. On the other hand, in the case of using the screen process printing plate according to the present invention, permanent deformation of the screen can be avoided. Consequently, the gap G can be set to a large value. Since the value of the gap G can be set relatively freely, snapping-off of the screen in printing can be made most effectively.

The present invention was described in connection with the above-described preferred embodiment. However, the present invention is not limited thereto. For example, referring to FIG. 15, the screen 184 does not need to be of rectangular shape. The screen 184 may have any form insofar as it can be set on the holding thin plate portions 164 and the mounting portions 166, 168 and even distribution of tension can be set. For example, in a screen process printing plate shown in FIG. 15, the screen 184 has an octagonal form attached to respective central portions of the two holding thin plate portions 164 and two mounting portions 166, 168.

Figure 15:
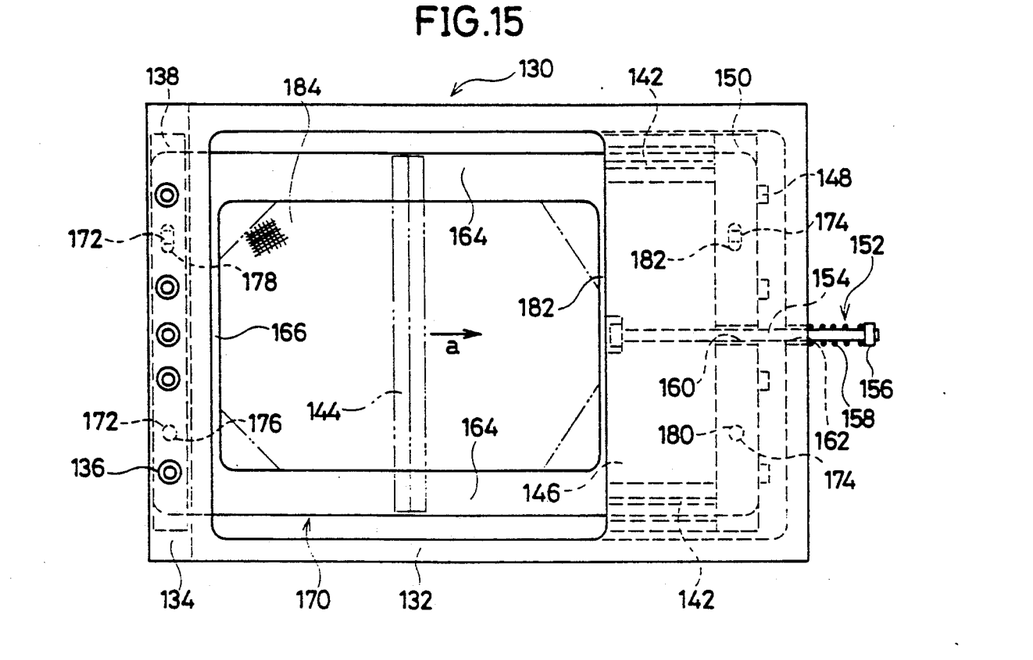
FIG. 15 is a plan view of a screen process printing plate of another embodiment of the present invention.

In FIG. 15, the components identical to those shown in FIG. 9 are assigned identical reference characters and names. The functions and operations thereof are also the same as in FIG. 9. Therefore, the detailed description thereof is not repeated here.

Other various alterations can be made with respect to the present invention. For example, in the above-described embodiment, the holding member 170 is fixed to the holding frame body 132 by means of the fixing frame body 138. However, the fixing frame body 138 is not necessarily required and the mounting portions of the holding member can be fixed directly to the holding frame body 132. Similarly, the mounting portion 150 of the movable frame body 146 is not necessarily required and the screen may be fixed directly on the movable frame body 146.

In the above-described embodiment, the fixed frame body 138, the movable frame body 146 and the like are mounted on the rectangular holding frame body 132 in a detachable manner. However, the present invention is not limited thereto. For example, the fixed frame body 138 may be mounted directly on the main body of the printing apparatus and the movable frame body 146 may be supported movably by the main body of the printing apparatus through guide means.

In the above-described embodiment, the pair of holding thin plate portions are formed by a thin plate material. However, the holding thin plate portions may include two strip-shaped thin plate portions and may be attached to the fixed frame body and the movable frame body so that the two thin plate portions may be parallel.

In the above-described embodiment, a pair of holding thin plates are used. However, additional thin plates may be provided in portions causing no inconvenience to the printing pattern. In addition, the biasing means is not limited to the means mentioned in the above-described embodiment. For example, the biasing means may include a tension spring for biasing the movable frame body.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A screen process printing plate comprising:
   screen holding means having an opening and formed of a flat plate having flexibility and restoring capability:
   printing screen means fixed to said screen holding means, the printing screen means covering at least a part of said opening and defining a plane substantially coincident with a surface of said screen holding means;
   expansibility of said screen holding means in said defined plane being smaller than expansibility of said printing screen means in said plane;
   a fixed member for fixedly holding one end of said screen holding means;
   a movable member attached to an opposite end of said screen holding member and movable along a predetermined straight line parallel to the plane defined by said printing screen means;
   biasing means for biasing said movable member in a prescribed first direction away from said fixed member along said straight line;
   said opening defined by a pair of first sides parallel to said prescribed first direction and by a pair of second sides intersecting with said pair of first sides; and
   said screen holding means comprising a pair of screen holding portions defining said respective first sides and extending in said prescribed first direction, the flexibility of said screen holding means being such that upon application of a force to said screen holding means in a direction transverse to said plane, said screen holding portions deform in the direction of the force, and the restoring capability of the screen holding means being such that upon removal of the force said screen holding portions are restored to their original positions.

2. A screen process printing plate in accordance with claim 1, wherein said screen holding means has an even thickness.

3. A screen process printing plate in accordance with claim 1, wherein;
said screen holding means includes:
a fixed member mounting portion defining one of said second sides and enabling said screen holding means to be fixed to said fixed member;
a movable member mounting portion defining the other of said second sides and enabling said screen holding means to be attached to said movable member; and
a pair of screen holding portions defining said respective first sides and extending in said first direction between said fixed member mounting portion and said movable member mounting portion.

4. A screen process printing plate in accordance with claim 3, wherein
said printing screen means is fixedly attached to said pair of screen holding portions on said pair of first sides, whereby
deformation of said printing screen means in said first direction is regulated and said printing screen means is deformed according to deformation of said screen holding portions in the direction intersecting with said plane.

5. A screen printing plate in accordance with claim 1, wherein
said printing screen means is fixedly attached to said screen holding means on the pair of first sides and the pair of second sides defining said opening.

6. A screen process printing plate in accordance with claim 5, wherein
said printing screen means covers the whole of said opening.

7. A screen process printing plate in accordance with claim 2, further comprising a frame for defining a relative position between said fixed member and said biasing means.

8. A screen process printing plate in accordance with claim 7, further comprising a frame having a fixed member mounting portion to which the fixed member is fixedly attached and a movable member mounting portion to which the movable member is slidably attached for movement in the first direction.

9. A screen process printing plate comprising:
screen holding means of even thickness having an opening and formed of a flat plate having flexibility and restoring capability;
printing screen means fixed to said screen holding means, the printing screen means covering at least a part of said opening and defining a plane substantially coincident with a surface of said screen holding means, the flexibility of said screen holding means being such that upon application of a force to said screen holding means in a direction transverse to said plane, said screen holding portions deform in the direction of the force, and the restoring capability of the screen holding means being such that upon removal of the force said screen holding portions are restored to their original positions;
expansibility of said screen holding means in said defined plane being smaller than expansibility of said printing screen means in said plane;
a fixed member for fixedly holding one end of said screen holding means;
a moveable member attached to an opposite end of said screen holding member and movable along a predetermined straight line parallel to the plane defined by said printing screen means;
biasing means for biasing said movable member in a prescribed first direction away from said fixed member along said straight line, said biasing means including moveable member following means moving according to the movement of said movable member forward said fixed member in a direction opposite to said first direction and said biasing means biasing said movable member following means toward said first direction; and
a frame for defining a relative position between said fixed member and said biasing means.

10. A screen process printing plate in accordance with claim 9, wherein the frame includes a through-hole and the movable member includes a shaft slidably received in the frame through-hole and having a first end fixed to the movable member and a portion protruding from the through-hole in the first direction.

11. A screen process printing plate in accordance with claim 10, wherein the protruding portion of the shaft has an enlarged section and wherein the means for biasing the movable member includes a spring surrounding the protruding portion, the spring having one end in engagement with the frame and an opposite end in engagement with the enlarged section.

* * * * *